United States Patent
Choi et al.

(10) Patent No.: US 11,434,584 B2
(45) Date of Patent: Sep. 6, 2022

(54) APPARATUS FOR GROWING SINGLE CRYSTAL METAL-OXIDE EPI WAFER

(71) Applicant: T.O.S Co., Ltd., Osan-si (KR)

(72) Inventors: Bum Ho Choi, Goyang-si (KR); Seung Soo Lee, Suwon-si (KR); Yeong Geun Jo, Osan-si (KR); Yong Sik Kim, Suwon-si (KR)

(73) Assignee: T.O.S Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/106,459

(22) Filed: Nov. 30, 2020

(65) Prior Publication Data

US 2021/0285128 A1  Sep. 16, 2021

(30) Foreign Application Priority Data

Mar. 16, 2020  (KR) .................. 10-2020-0031950

(51) Int. Cl.
  C30B 35/00  (2006.01)
  C30B 23/08  (2006.01)
  C23C 14/08  (2006.01)
  C23C 14/30  (2006.01)

(52) U.S. Cl.
  CPC ............ C30B 35/00 (2013.01); C23C 14/086 (2013.01); C23C 14/30 (2013.01); C30B 23/08 (2013.01)

(58) Field of Classification Search
  CPC ..... C23C 14/086; C23C 14/30; C30B 23/066; C30B 23/08; C30B 35/00
  See application file for complete search history.

(56) References Cited

U.S. PATENT DOCUMENTS

| | | | | |
|---|---|---|---|---|
| 4,105,924 A | * | 8/1978 | Hinkel | .................... C23C 14/48 |
| | | | | 250/442.11 |
| 4,385,946 A | * | 5/1983 | Finegan | ................ H01L 21/265 |
| | | | | 117/108 |
| 7,838,083 B1 | * | 11/2010 | Youchison | ............ C23C 14/024 |
| | | | | 427/529 |
| 2008/0226220 A1 | * | 9/2008 | Forbes | ................... B82Y 20/00 |
| | | | | 385/14 |
| 2010/0040859 A1 | * | 2/2010 | Chang | ............. H01L 31/022475 |
| | | | | 428/304.4 |

(Continued)

FOREIGN PATENT DOCUMENTS

JP          64021973 A  *  1/1989  ............. H01L 39/12

*Primary Examiner* — Matthew J Song
(74) *Attorney, Agent, or Firm* — Finch & Maloney PLLC; Jay S. Franklin; Michael J. Bujold

(57) ABSTRACT

Disclosed herein is an apparatus for growing a single crystal metal-oxide epi wafer, including a reaction chamber having an internal space, a substrate mounting unit disposed in the internal space and allowing a substrate to be mounted thereon, a metal-oxide treating unit treating a metal-oxide to supply metal ions and oxygen ions generated from the metal-oxide to the substrate, and an arsenic supply unit installed to face the substrate and supplying arsenic ions to the substrate, wherein the metal-oxide treating unit includes a mount disposed to face the substrate in the internal space and allowing a zinc oxide plate which is the metal-oxide to be installed thereon, and an electron beam irradiator irradiating the zinc oxide plate with an electron beam in a direct manner to cause zinc ions and oxygen ions evaporated from the zinc oxide plate to move toward the substrate.

11 Claims, 2 Drawing Sheets

(56) References Cited

U.S. PATENT DOCUMENTS

| | | | | |
|---|---|---|---|---|
| 2013/0224889 A1* | 8/2013 | Koyama | ............... | C23C 16/045 438/4 |
| 2013/0292244 A1* | 11/2013 | Ockenfuss | .............. | H01J 37/34 204/192.22 |
| 2017/0186984 A1* | 6/2017 | Hosono | ............... | C23C 14/3414 |

* cited by examiner

APPARATUS FOR GROWING SINGLE CRYSTAL METAL-OXIDE EPI WAFER

CROSS REFERENCE TO RELATED APPLICATION

This application claims the benefit of Korean Patent Application No. 10-2020-0031950, filed on Mar. 16, 2020, entitled "APPARATUS FOR GROWING SINGLE CRYSTAL METAL-OXIDE EPI WAFER", which is hereby incorporated by reference in its entirety into this application.

BACKGROUND

Field

The present invention relates to an apparatus for growing a single crystal metal-oxide epi wafer.

Description of the Related Art

In general, oxide thin films including zinc oxide-based compounds such as indium tin oxide (ITO), zinc oxide (ZnO) and AZO, GZO, IGZO, etc. have been widely used in a transparent electrode used as a positive electrode of a display panel of a liquid crystal display (LCD), an organic light emitting diode (OLED), etc., a channel layer for charge transport of a thin film transistor for pixel driving, and positive/negative electrodes of solar cells so as to be commercialized, and have been researched and developed as a core electrode material and an active layer material of a transparent electronic device, which is a next-generation electronic device. In addition, many research studies and development achievements of a light emitting diode (LED) as a light emitting layer have been reported.

In the case of the above application field, mobility of electrons is greater than mobility of holes, in addition to forming a polycrystalline oxide semiconductor thin film, and thus the oxide semiconductor thin film having an n-type characteristic having an advantage in terms of a signal processing rate may be used without a problem in many cases. Therefore, a process such as doping an acceptor for formation of a p-type oxide thin film having the opposite characteristics and a technology for equipment capable of performing the process have rarely been presented.

Nitrogen has been studied a lot as a dopant for forming a p-type zinc oxide thin film, but it is difficult to form an effective p-n junction with reproducibility, so an application field remains in transistor fabrication, and as an alternative, Na, Li, Ag, Sb, B, As, etc. have been studied. The most probable material among these materials is arsenic, and arsenic is considered an optimal material in the current technology because it is easy to control a concentration of arsenic (As) ions acting as a receptor and it is easiest to adjust properties of arsenic, compared to other materials.

However, in MOCVD technology, the content of hydrogen and carbon in a metalorganic source used as a raw material is so high that there is a high possibility of an occurrence of O—H bonds rather than bonds of As used as a dopant and Zn—O when a p-type zinc oxide thin film is grown. As a result, the probability that As ions participate as a dopant in Zn—O bonds to generate Zn—O—As bonds is significantly low.

SUMMARY

An object of the present invention is to provide an apparatus for growing a single crystal metal-oxide epi wafer, capable of effectively forming a high-purity p-type zinc oxide thin film by injecting arsenic as a receptor material.

Another object of the present invention is to provide an apparatus for growing a single crystal metal-oxide epi wafer, capable of increasing production yield by presenting a process technology capable of growing a high-purity single crystal zinc oxide substrate.

According to an exemplary embodiment of the present invention, there is provided an apparatus for growing a single crystal metal-oxide epi wafer, including: a reaction chamber having an internal space; a substrate mounting unit disposed in the internal space and allowing a substrate to be mounted thereon; a metal-oxide treating unit treating a metal-oxide to supply metal ions and oxygen ions generated from the metal-oxide to the substrate; and an arsenic supply unit installed to face the substrate and supplying arsenic ions to the substrate, wherein the metal-oxide treating unit includes a mount disposed to face the substrate in the internal space and allowing a zinc oxide plate which is the metal-oxide to be installed thereon; and an electron beam irradiator irradiating the zinc oxide plate with an electron beam in a direct manner to cause zinc ions and oxygen ions evaporated from the zinc oxide plate to move toward the substrate.

The substrate mounting unit and the electron beam irradiator may be installed on an upper side of the reaction chamber, and the mount may be installed on a lower side of the reaction chamber.

An irradiation angle of the electron beam irradiator with respect to the zinc oxide plate may be determined in the range of 40°.

The electron beam irradiator may operate with power of 30 kW using an acceleration voltage of 30 kV and an emission current of 1 A.

The substrate mounting unit and the mount may be disposed such that a distance between the zinc oxide plate and the substrate is in the range of 800 mm to 1,800 mm.

The arsenic supply unit may operate in the range of 500° C. to 1,100° C. to ionize arsenic, and supply $As_2^+$ as the arsenic ions.

The apparatus may further include: an oxygen supply unit installed to face the substrate, dissociating oxygen molecules in a gaseous state, and supplying oxygen radicals to the substrate.

The metal-oxide treating unit and the oxygen supply unit may be disposed on opposite sides with respect to the substrate mounting unit, and the arsenic supply unit may be located between the metal-oxide treating unit and the oxygen supply unit.

The reaction chamber may further include: a partition protruding from a bottom defining the internal space and disposed between the oxygen supply unit and the arsenic supply unit to prevent the oxygen radicals discharged from the oxygen supply unit from moving toward the arsenic supply unit and the metal-oxide treating unit.

The oxygen supply unit may include: a discharge port having a level lower than a bottom defining the internal space of the reaction chamber; and a gate valve opening and closing the discharge port.

An orientation angle of the oxygen supply unit with respect to the substrate may be determined in the range of 20° to 40°.

The apparatus may further include: a driving unit, in a state of being connected to the substrate mounting unit, installed in the reaction chamber to drive the substrate mounting unit, wherein the driving unit is configured to cause the substrate mounting unit to move in a direction away from or toward the arsenic supply unit or cause the substrate mounting unit to rotate.

The apparatus may further include: a heater unit installed to correspond to the substrate mounting unit to heat the substrate, wherein the heater unit operates at 750° C. to 1000° C. so that the substrate is maintained at a temperature of 550° C. to 800° C. during film formation.

With the apparatus for growing a single crystal metal-oxide epi wafer according to the present invention configured as described above, unlike the related art MOCVD in which it is difficult to grow a p-type zinc oxide thin film, a p-type zinc oxide single crystal thin film may be formed by supplying arsenic acting as a receptor in the process of growing a zinc oxide epi layer.

In addition, compared to the related art in which electron beam irradiator is located at a lower portion of the reaction chamber and uses a deflection method that diffracts 180 to 270° to irradiate the zinc oxide plate with an electron beam at a close distance, so it is possible to use only power in the range of 6 to 15 kW, in the present invention, a high power output up to twice as much is used by a direct method, thereby increasing the amount of zinc oxide to increase a deposition rate, and thus production yield may be increased

DETAILED DESCRIPTION

Figure 1:
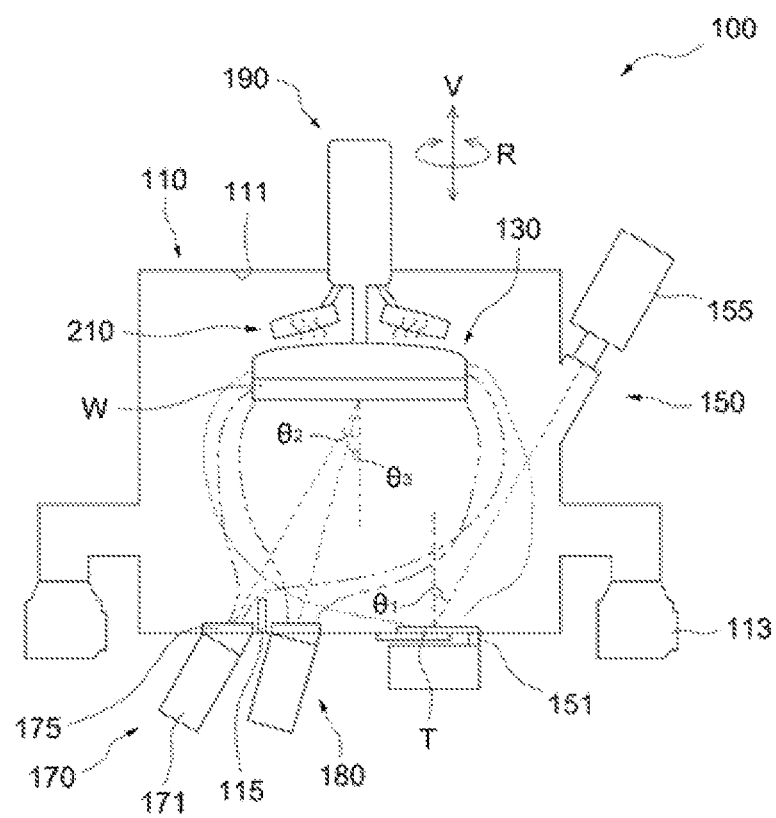
FIG. 1 is a conceptual diagram of an apparatus for growing a single crystal metal-oxide epi wafer according to an embodiment of the present invention.

Hereinafter, an apparatus for growing a single crystal metal-oxide epi wafer according to a preferred embodiment of the present invention will be described in detail with reference to the accompanying drawings. In the present invention, the same or similar reference numerals are assigned to the same or similar components even in different embodiments, and a description thereof is replaced with a first description.

FIG. 1 is a conceptual diagram of an apparatus 100 for growing a single crystal metal-oxide epi wafer according to an embodiment of the present invention.

Referring to FIG. 1, the apparatus 100 for growing a single crystal metal-oxide epi wafer includes a reaction chamber 110, a substrate mounting unit 130, a metal-oxide treating unit 150, an oxygen supply unit 170, a driving unit 190, and a heater unit 210.

The reaction chamber 110 includes an internal space 111, and a high-purity zinc oxide thin film growth process is performed in the internal space 111. In the internal space 111, a vacuum level of $10^{-8}$ to $10^{-9}$ torr is basically formed and a vacuum level of $10^{-5}$ to $10^{-6}$ torr is formed during growth. To this end, a vacuum pump 113 is connected to the internal space 111. The reaction chamber 110 may be further connected to a loadlock chamber. The loadlock chamber may be divided into two spaces, i.e., a substrate storage area maintaining a vacuum level of $10^{-3}$ torr and a substrate transfer area maintaining a vacuum level of $10^{-8}$ to $10^{-9}$ torr. The loadlock chamber may include an automatic transfer device for transferring the substrate mounting unit 130 on which a substrate W is mounted, a preheating unit for shortening an outgassing time of metal-oxides, and a slot capable of keeping at least five substrate holders in storage. The degree of vacuum of the loadlock chamber may be maintained at a level of $10^{-8}$ to $10^{-9}$ torr, which is a vacuum level of the reaction chamber 110 during the process. The transfer of the substrate W between the loadlock chamber and the reaction chamber 110 is performed by a robot. In addition, a partition 115 protrudes from a bottom of the internal space 111.

The substrate mounting unit 130 is disposed in the internal space 111 and allows a substrate W to be mounted thereon. The substrate mounting unit 130 has a size capable of mounting a maximum of 108 4-inch sapphire substrates. The substrate mounting unit 130 is transported from the loadlock chamber and attached to a cradle installed in the reaction chamber 110. To this end, four electromagnets are installed at a connection portion between the cradle and the substrate mounting unit 130 to attach the cradle and the substrate mounting unit 130, and thereafter, the substrate mounting unit 130 may be moved up to a position where a temperature of the substrate W is maintained at 550° C. to 800° C. in proximity to the heater unit 210 located above when the epi layer is grown. In order to transport the substrate mounting unit 130 to the loadlock chamber, the cradle may be lowered by about 80 mm after completion of the epi layer growth process, a magnetic field of the electromagnets is released so that the substrate mounting unit 130 may be seated in a transportation system, and the transported substrate mounting unit 130 may be kept in a slot provided in the loadlock chamber. In order to control a position of the substrate mounting unit 130, a position sensor may be installed at a position at which the substrate mounting unit 130 is attached to the cradle and a position from which the substrate mounting unit 130 needs to move up for the epi layer growth process, thereby controlling an accurate position of the substrate mounting unit 130.

The metal-oxide treating unit 150 is configured to treat a metal-oxide so that metal ions and oxygen ions generated from the metal-oxide are supplied to the substrate W. In the present embodiment, treating the metal-oxide refers to irradiating the metal-oxide with an electron beam to cause metal ions and oxygen ions to be evaporated and move toward the substrate W.

Here, the metal-oxide is a zinc oxide plate as a specific example, which may be manufactured by sintering zinc oxide powder. Accordingly, the metal ion may be $Zn^{2+}$ and the oxygen ion may be $O^{2-}$. The zinc oxide plate has a diameter of 8 inches and a thickness of 2 inches and has a capacity of 900 $cm^3$ on the assumption of a case of 100% vaporization. If epi-growth is performed 5 times a day, the zinc oxide plate can be used for up to 4 months and is an appropriate amount for mass production. In the zinc oxide plate, a temperature of zinc oxide in a region sublimated from a solid state to a gaseous state by the irradiated electron beam is between 1,000° C. and 1,500° C. and a melting point is 1,950° C.

The zinc oxide plate may be installed on a mount 151. The mount 151 is installed at a lower side in the internal space 111 and disposed to face the substrate mounting unit 130.

Zinc oxide is a ceramic-based material and has a low thermal conductivity of only about 5 W/mK, which is 14% of that of metal. Deformation due to thermal stress occurring in the zinc oxide plate due to a temperature difference between an evaporation region having a locally high temperature and other regions by electron beam irradiation should be prevented. To this end, a heater unit (not shown) may be installed to minimize the temperature gradient around the zinc oxide plate. Such a heater unit may be installed on the mount 151 to surround the zinc oxide plate, and the zinc oxide plate may be divided into at least five temperature regions and the heater unit may differentially heat the regions such that a temperature difference between each region does not exceed 300° C.

As a method of increasing use efficiency of the zinc oxide plate by creating a uniform erosion profile of the zinc oxide plate, a device (FIG. 2) that rotates the zinc oxide plate at regular intervals of use may be additionally provided on the mount 151. A rotation angle of the zinc oxide plate may be 45° and the zinc oxide plate may be rotated a total of 8 times until its replacement.

In order to prevent clogging by zinc oxide vapor that may occur at initial evaporation, a shutter of 9 inches or greater in diameter may be installed at a certain point above the zinc oxide plate, for example, at a position of 70 mm away from the zinc oxide plate. In this case, a material of the shutter may be a stainless steel compound, tantalum or aluminum.

When an electron beam having high energy is incident on the zinc oxide plate, back-scattered electrons are generated due to scattering of electrons. Energy of the back-scattered electrons is known to be at a level similar to that of the electron beam incident on a zinc oxide plate. In order to minimize problems such as heat caused by the back-scattered electrons, a trap formed of a metal material capable of collecting the back-scattered electrons may be installed around the zinc oxide plate.

An electron beam irradiator 155 for irradiating the zinc oxide plate with an electron beam is installed on an upper side of the internal space 111. The electron beam irradiator 155 may be positioned at substantially the same height as the substrate mounting unit 130. The electron beam irradiator 155 is configured to directly irradiate an electron beam onto the zinc oxide plate by positioning an electron beam source directly above (90°) the reaction chamber 110 or at an angle $\theta_1$ within 40° of the reaction chamber 110. The irradiation angle $\theta_1$ may preferably be within 20°. In a case where an acceleration voltage of the electron beam is high, it is important to minimize the amount of secondary electrons generated after irradiation on the zinc oxide plate. If the irradiation angle of the electron beam exceeds 40°, the ratio of generated secondary electrons rapidly increases to reach a level of 50%, which works as factors that adversely affect zinc oxide evaporation efficiency, zinc oxide plate use efficiency, and contamination of a wall of the reaction chamber 110, and thus it is preferable to adjust the irradiation angle within 20°.

As for the electron beam irradiated from the electron beam irradiator 155, maximum power is 60 kW using an acceleration voltage in the range of 5 to 30 kV and an emission current of up to 2 A.

A distance between the zinc oxide plate and the electron beam irradiator 155 may be between 600 and 1,800 mm and should not exceed 1,800 mm at most. In addition, when the number of substrates mounted on the substrate mounting unit 130 is large (for example, 108 4-inch substrates), the distance between the zinc oxide plate and the substrate W may be appropriately 800 to 1,800 mm. If the distance is less than 800 mm, it is impossible to grow a uniform epi layer on the entire substrate W, and if the distance is greater than 1,800 mm, a uniform epi layer may be grown but a deposition rate may be too slow.

The oxygen supply unit 170 is configured to additionally supply oxygen radicals O to the substrate W by dissociating oxygen molecules in a gaseous state. The oxygen supply unit 170 is installed in the reaction chamber 110 to face the substrate W.

When a zinc oxide single crystal is grown, the ratio of Zn:O should be 1:1 in theory. However, when an actual component analysis is performed, a phenomenon in which the ratio of O is lower than that of Zn naturally occurs due to the nature of the zinc oxide thin film. Therefore, in order to adjust the ratio of Zn:O to 1:1, oxygen radicals are supplied to the substrate W through the oxygen supply unit 170. Here, the supplied oxygen should be oxygen radicals dissociated by heat or plasma, rather than $O_2$.

An RF atom source may be used as the oxygen supply unit 170, which is a structure mounted at a lower portion of the reaction chamber 110. A mounting angle $\theta_2$ thereof is between 20° and 40° from a position facing the substrate W, and may preferably be within 30°. The RF atom source may have a shutter at an end thereof in order to prevent spitting or clogging at the beginning of oxygen radical supply. In addition, the RF atom source has a nozzle for injecting oxygen radicals into the internal space 111 and includes an RF plasma source and power supply device for dissociation of O2, an impedance matching system, and the like. Direct plasma or remote plasma may be selected as the plasma system, but in this embodiment, a remote plasma method is selected to minimize the effect of plasma.

In order to efficiently dissociate $O_2$, RF plasma power may be used in the range of 300 W to 750 W, and preferably, 500 W is suitable. A distance between the RF atom source for supplying oxygen radicals and the substrate W is 800 to 1,400 mm, and preferably, 800 mm.

An excessive amount of supplied oxygen radicals may help fill an empty space of oxygen radicals in the zinc oxide epi layer but may degrade performance due to oxidation of the reaction chamber 110 and components present in the internal space 111. If the amount of oxygen radicals is too small, sufficient oxygen is not supplied to the zinc oxide epi layer, and thus voids of the oxygen radicals cannot be filled to degrade the performance of the zinc oxide epi layer. Therefore, it is important to select an appropriate supply amount. In this embodiment, a supply amount of oxygen radicals at which a vacuum degree of $10^{-5}$ torr is maintained when the aforementioned oxygen radicals are supplied is selected.

Further, in order to prevent oxidation of peripheral components by oxygen radicals supplied from the oxygen supply unit 170, the oxygen supply unit 170 and the metal-oxide treating unit 150 may be disposed on the mutually opposite sides with respect to the substrate mounting unit 130. Further, an arsenic supply unit 180 to be described later is disposed therebetween. In addition, the partition 115 prevents oxygen radicals derived from the oxygen supply unit 170 from moving toward the arsenic supply unit 180 and the metal-oxide treating unit 150.

As another method, a discharge port 171 of the oxygen supply unit 170 may be located at a level lower than the bottom of the internal space 111. In such a structure, a gate valve 175 for opening and closing the discharge port 171 may be installed at the discharge port 171. The gate valve 175 may be opened and closed so that oxygen radicals may flow into the internal space 111 only while the zinc oxide thin film is grown on the substrate W.

The arsenic supply unit 180 is a component for supplying arsenic ions to the substrate W. The arsenic supply unit 180 may be installed on the bottom of the reaction chamber 110 and disposed to face the substrate W.

As the arsenic supply unit 180, for example, a Knudsen cell (K-cell) may be used. The arsenic supply unit 180 decomposes arsenic, which is solid at room temperature, at a temperature range of 500 to 1,100° C., preferably 600 to 1,100° C., and supplies ions in the $As^{2+}$ state to the substrate W. In the case of supplying $AS_4^+$, among arsenic ions, to the substrate W, a high-quality p-type zinc oxide film is not formed because chemical bonds between Zn—O—As do not match. Therefore, it is important to produce $As_2^+$ in the above temperature range. In addition, a mounting angle θ3 at which the arsenic supply unit 180 faces the substrate W is between 20° and 40°. The arsenic supply unit 180 may further have a control valve to adjust the amount of arsenic ions (ultimately $As_2^+$ doping concentration) to suit the characteristics of the epi thin film in a range of $10^{17}$ to $10^{21}$ pcs/cm³.

In order to control an increase in an impurity concentration due to a spitting phenomenon of $As_2^+$ acceptors at the beginning of decomposing arsenic and supplying decomposed arsenic to the substrate, the arsenic supply unit 180 has its own shutter and a heater unit for applying heat to decompose arsenic. In addition, the arsenic supply unit 180 may include a reservoir for storing arsenic.

The driving unit 190 is a component for driving the substrate mounting unit 130. The driving unit 190, in a state of being connected to the substrate mounting unit 130, may be installed in the reaction chamber 110. Specifically, the driving unit 190 may cause the substrate mounting unit 130 to move in a direction away from or close to the bottom of the reaction chamber 110 in a vertical direction V. Furthermore, the driving unit 190 may rotate the substrate mounting unit 130 in a rotation direction R.

Specifically, the driving unit 190 may move the substrate mounting unit 130 up and down 50 to 100 mm, preferably, 80 mm, in the vertical direction V. In addition, for uniform thin film deposition on the substrate W, the driving unit 190 may rotate the substrate mounting unit 130 at a speed of 5 to 50 rpm, preferably, 10 rpm. In this case, the driving unit 190 may rotate only the cradle so that the entire substrate mounting unit 130 rotates substantially.

The heater unit 210 may be provided to correspond to the substrate mounting unit 130 to heat the substrate W. The heater unit 210 may be installed in the reaction chamber 110 or the driving unit 190 and located in the internal space 111. The heater unit 210 may operate at 750° C. to 1000° C. so that the substrate W may be maintained at a temperature of 550° C. to 800° C. during film formation. One to four heater units 210 may be installed to uniformly maintain a temperature of the entire substrate W. The heater unit 210 is designed to transfer heat to the substrate W by radiant heat in a vacuum.

Figure 2:
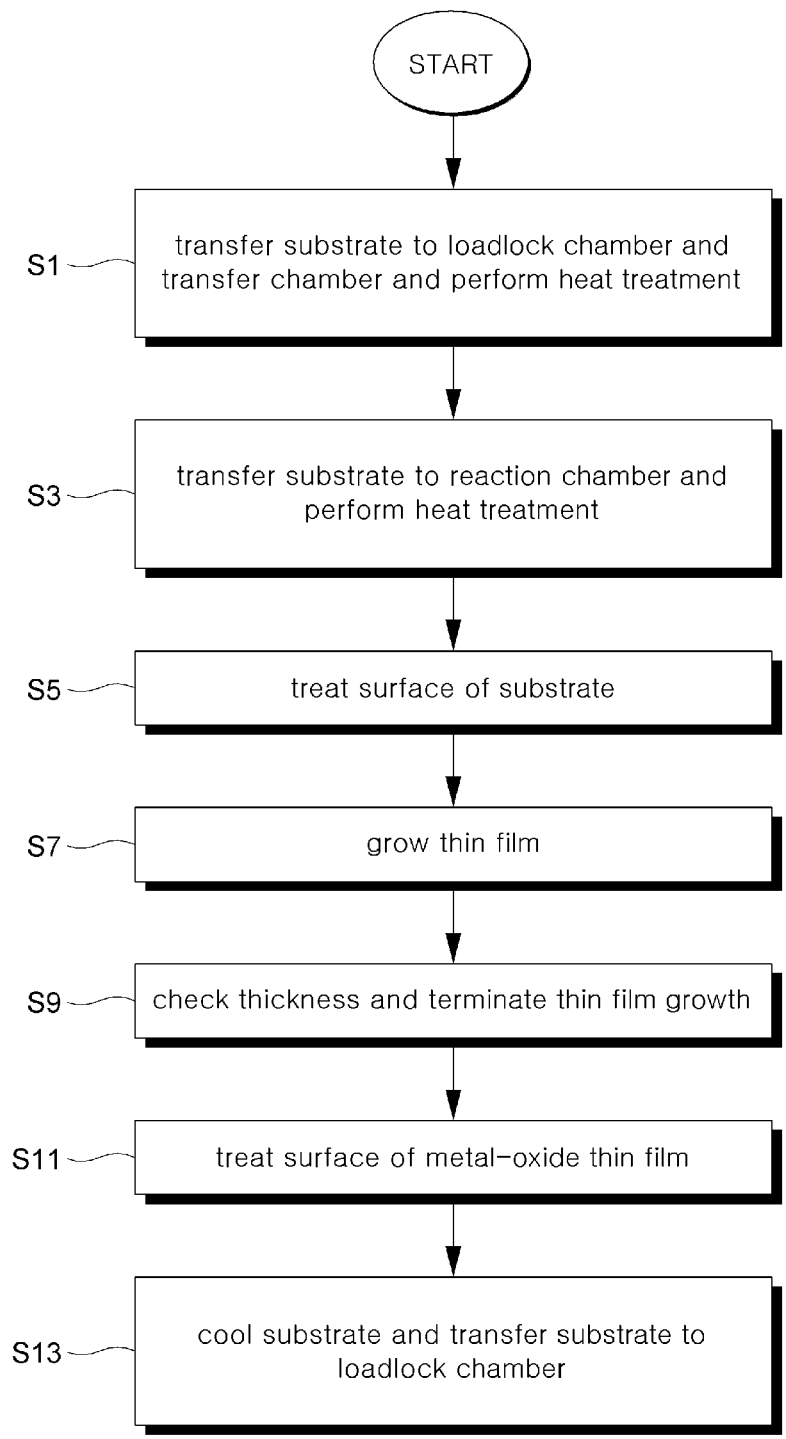
FIG. 2 is a flowchart illustrating a process of forming a single crystal metal-oxide semiconductor layer using the apparatus for growing a single crystal metal-oxide epi wafer of FIG. 1

A process of forming a single crystal metal-oxide semiconductor layer using the apparatus 100 for growing a single crystal metal-oxide epi wafer will be described with reference to FIG. 2. FIG. 2 is a flowchart showing a process of forming a single crystal metal-oxide semiconductor layer using the apparatus 100 for growing a single crystal metal-oxide epi wafer of FIG. 1.

Referring to this drawing (and FIG. 1), first, the substrate W is transferred and heat-treated (S1). Specifically, the substrate mounting unit 130 on which the substrate W is mounted is inserted into the loadlock chamber. Here, an outgassing process is performed through a heat treatment process at a temperature of 300° C. Here, a heat treatment time is preferably 5 to 30 minutes, and the loadlock chamber is maintained at a pressure of $10^{-3}$ torr. The heat-treated substrate W is transferred to a transfer chamber region in an ultra-high vacuum state of $10^{-8}$ torr and undergoes an outgassing process for 5 to 30 minutes.

Thereafter, the substrate W is transferred to the reaction chamber 110 and subjected to a heat treatment (S3). Specifically, after the gate valve connected between the transfer chamber and the reaction chamber 110 is opened, the substrate W is transferred to the reaction chamber 110. Thereafter, as the gate valve is closed, the transfer chamber and the reaction chamber 110 are separated. Here, a vacuum degree of the reaction chamber 110 is maintained at $10^{-8}$ torr so as to be the same as the vacuum degree of the transfer chamber. Power is supplied to the heater unit 210 in the reaction chamber 110 to increase the temperature of the substrate W to 600° C. to 700° C., and a third outgassing process is performed.

Now, a surface treatment is performed on the substrate W (S5). By performing a substrate surface treatment process using oxygen plasma, a natural oxide film so thin as not to interfere with the growth of the single crystal metal-oxide film is formed on the surface of the substrate W. A substrate treatment time using oxygen plasma may be between 10 and 60 seconds. In this case, in order to remove impurities in the form of organic substances that may exist on the surface of the substrate W, a substrate surface treatment process may be performed using hydrogen plasma. The substrate treatment time using hydrogen plasma is preferably within 30 seconds.

A thin film is grown on the substrate W (S7). While the substrate W is rotated at a speed of 5 to 50 rpm, an evaporation process of the metal-oxide may be performed. When performing the evaporation process of metal-oxide, in order to prevent a large amount of metal-oxide from being evaporated and transferred to the substrate at one time at an initial stage, a metal-oxide gas is blocked by a shutter provided on an evaporation source (zinc oxide plate) side, and when a sublimation rate reaches a certain amount, the shutter may be moved to allow the metal-oxide gas to move to the substrate W. At the same time, oxygen radicals dissociated by plasma are simultaneously supplied to the substrate W, thereby forming a metal-oxide layer on the substrate W. $As_2^+$ is supplied to the substrate W to form a p-type metal-oxide layer, and at this time, the arsenic divalent material is supplied immediately after the metal-oxide gas and oxygen radicals are supplied.

A thin film growth terminating step is followed (S9). It may be checked that a p-type metal-oxide thin film having a desired thickness has been formed using a thickness measuring device, and thereafter, supply of metal-oxide gas, oxygen radicals, and arsenic divalent ions may be stopped and the rotation of the substrate W may be simultaneously stopped.

Thereafter, a surface treatment is performed on the thin film (S11). To form a single crystal metal-oxide thin film, a heat treatment process is performed at a temperature of 700° C., and here, a heat treatment time may be 10 to 30 minutes, and preferably, 30 minutes.

Finally, the substrate is transferred (S13). After cooling a temperature of the substrate W, the substrate W is moved in order of the transfer chamber and the loadlock chamber.

The apparatus for growing a single crystal metal-oxide epi wafer as described above is not limited to the configuration and operation method of the embodiments described above. The above embodiments may be configured so that all or a part of each of the embodiments may be selectively combined to make various modifications.

What is claimed is:

1. An apparatus for growing a single crystal metal-oxide epi wafer, the apparatus comprising:
   a reaction chamber having an internal space;
   a substrate mounting unit mounted on the reaction chamber in the internal space and a substrate mounted on the substrate mounting unit;

a metal-oxide treating unit mounted on the reaction chamber and supporting a metal-oxide, the metal-oxide treating unit generates metal ions and oxygen ions from the metal-oxide, the metal-oxide treating unit arranged to supply the metal ions and the oxygen ions to the substrate, an oxygen supply unit mounted on the reaction chamber facing the substrate, the oxygen supply unit dissociating oxygen molecules in a gaseous state to supply oxygen radicals to the substrate; and an arsenic supply unit installed on the reaction chamber facing the substrate and supplying arsenic ions to the substrate, wherein the metal-oxide treating unit includes a mount and an electron beam irradiator, the mount disposed on the reaction chamber facing the substrate in the internal space, the metal-oxide is a zinc oxide plate ; and the electron beam irradiator irradiating the zinc oxide plate with an electron beam in a direct manner to cause zinc ions and the oxygen ions evaporated from the zinc oxide plate to move toward the substrate; and the oxygen supply unit and the metal-oxide treating unit being mounted on opposite sides of the reaction chamber relative to the substrate mounting unit to restrict oxidation of the metal-oxide treating unit by the oxygen radicals supplied by the oxygen supply unit, and the arsenic supply unit being located between the metal-oxide treating unit and the oxygen supply unit.

2. The apparatus of claim 1, wherein the substrate mounting unit and the electron beam irradiator are installed on an upper side of the reaction chamber, and the mount is installed on a lower side of the reaction chamber.

3. The apparatus of claim 1, wherein an irradiation angle of the electron beam irradiator with respect to the zinc oxide plate is 40°.

4. The apparatus of claim 3, wherein the substrate mounting unit and the mount are disposed such that a distance between the zinc oxide plate and the substrate is in the range of 800 mm to 1,800 mm.

5. The apparatus of claim 1, wherein the electron beam irradiator operates with power of 30 kW using an acceleration voltage of 30 kV and an emission current of 1 A.

6. The apparatus of claim 1, wherein the arsenic supply unit operates in the range of 500° C. to 1,100° C. to ionize arsenic, and supplies $As_2$ +as the arsenic ions.

7. The apparatus of claim 1, wherein the reaction chamber further includes a partition protruding from a bottom defining the internal space and disposed between the oxygen supply unit and the arsenic supply unit to prevent the oxygen radicals discharged from the oxygen supply unit from moving toward the arsenic supply unit and the metal-oxide treating unit.

8. The apparatus of claim 1, wherein the oxygen supply unit includes:

a discharge port having a level lower than a bottom defining the internal space of the reaction chamber; and a gate valve opening and closing the discharge port.

9. The apparatus of claim 1, wherein an orientation angle of the oxygen supply unit with respect to the substrate is determined in the range of 20° to 40°.

10. The apparatus of claim 1, further comprising:

a driving unit, in a state of being connected to the substrate mounting unit, installed in the reaction chamber to drive the substrate mounting unit, wherein the driving unit is configured to move the substrate mounting unit in a vertical direction away from or toward the arsenic supply unit and to rotate the substrate mounting unit.

11. The apparatus of claim 1, further comprising:

a heater unit mounted in the internal space adjacent the substrate mounting unit to heat the substrate, and the heater unit being located on an upper side of the substrate mounting unit opposite the substrate, wherein the heater unit operates at 750° C. to 1000° C. so that the substrate is maintained at a temperature of 550° C. to 800° C. during film formation.

* * * * *